(12) United States Patent
Hsiao et al.

(10) Patent No.: US 9,647,060 B2
(45) Date of Patent: May 9, 2017

(54) ISOLATION STRUCTURE AND METHOD FOR FABRICATING THE SAME

(71) Applicant: UNITED MICROELECTRONICS CORP., Hsin-Chu (TW)

(72) Inventors: Shih-Yin Hsiao, Chiayi County (TW); Kuan-Liang Liu, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/859,348

(22) Filed: Sep. 20, 2015

(65) Prior Publication Data

US 2017/0047397 A1    Feb. 16, 2017

(30) Foreign Application Priority Data

Aug. 10, 2015   (TW) .............................. 104126006 A

(51) Int. Cl.
  *H01L 29/06* (2006.01)
  *H01L 21/762* (2006.01)

(52) U.S. Cl.
  CPC .... *H01L 29/0653* (2013.01); *H01L 21/76224* (2013.01)

(58) Field of Classification Search
  CPC .................. H01L 29/0653; H01L 21/76224
  See application file for complete search history.

(56) References Cited

U.S. PATENT DOCUMENTS

| | | | | |
|---|---|---|---|---|
| 6,333,548 B1* | 12/2001 | Yamane | ............. | H01L 27/0629 257/652 |
| 6,465,768 B1* | 10/2002 | Ker | ................ | H01L 21/823842 250/214.1 |
| 6,969,660 B2* | 11/2005 | Goda | ................ | H01L 21/76232 257/E21.549 |
| 7,719,064 B2 | 5/2010 | Wu et al. | | |
| 7,786,524 B2* | 8/2010 | Hazama | ................ | H01L 27/105 257/316 |
| 8,304,820 B2* | 11/2012 | Yamakoshi | ....... | H01L 27/11546 257/288 |
| 8,350,253 B1* | 1/2013 | Zhu | ................ | H01L 21/823807 257/19 |
| 8,373,238 B2* | 2/2013 | Lee | ................ | H01L 21/823431 257/401 |
| 8,722,512 B2* | 5/2014 | Kobayashi | ........ | H01L 21/76202 257/E21.409 |
| 8,836,067 B2 | 9/2014 | Hsu et al. | | |
| 2012/0267716 A1* | 10/2012 | Kao | ................ | H01L 29/66689 257/339 |

* cited by examiner

*Primary Examiner* — John C Ingham
*Assistant Examiner* — Gustavo Ramallo
(74) *Attorney, Agent, or Firm* — Winston Hsu; Scott Margo

(57) ABSTRACT

A method for fabricating isolation device is disclosed. The method includes the steps of: providing a substrate; forming a shallow trench isolation (STI) in the substrate, the STI includes a first STI and a second STI, and the first STI surrounds a first device region and the second STI surrounds a second device region; forming a first doped region between and contact the first STI and the second STI; and forming a first gate structure on the first doped region, the first STI and the second STI.

12 Claims, 4 Drawing Sheets

US 9,647,060 B2

ISOLATION STRUCTURE AND METHOD FOR FABRICATING THE SAME

BACKGROUND OF THE INVENTION

1. Field of the Invention

The invention relates to an isolation structure, and more particularly to a high-voltage device having a doped region between two isolation structures.

2. Description of the Prior Art

In current semiconductor processing, controllers, memories, circuits of low-voltage operation and power devices of high-voltage operation are largely integrated into a single chip to achieve a single-chip system. The power device, such as vertical double-diffusion metal-oxide-semiconductor (VDMOS), insulated gate bipolar transistor (IGBT) and lateral diffusion MOS (LDMOS), is employed to increase power switching efficiency and decrease the loss of energy resources. It is often required that the switching transistors withstand high breakdown voltages and operate at a low on-resistance.

In current high-voltage device fabrication, multiple dummy gate patterns are often formed on shallow trench isolations (STIs) to accommodate the needs of wiring redistribution. These dummy gate patterns and the doped regions within the substrate however not only reduce the isolation effect of the STI, but also induce current leakage when voltages are applied. Hence, how to improve the current high-voltage device architecture has become an important task in this field.

SUMMARY OF THE INVENTION

According to a preferred embodiment of the present invention, a method for fabricating isolation device is disclosed. The method includes the steps of: providing a substrate; forming a shallow trench isolation (STI) in the substrate, the STI includes a first STI and a second STI, and the first STI surrounds a first device region and the second STI surrounds a second device region; forming a first doped region between and contact the first STI and the second STI; and forming a first gate structure on the first doped region, the first STI and the second STI.

According to another aspect of the present invention, an isolation device is disclosed. The isolation device includes: a substrate; a shallow trench isolation (STI) in the substrate, in which the STI includes a first STI and a second STI, and the first STI surrounds a first device region and the second STI surrounds a second device region; a first doped region between and contact the first STI and the second STI; and a first gate structure on the first doped region, the first STI and the second STI.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
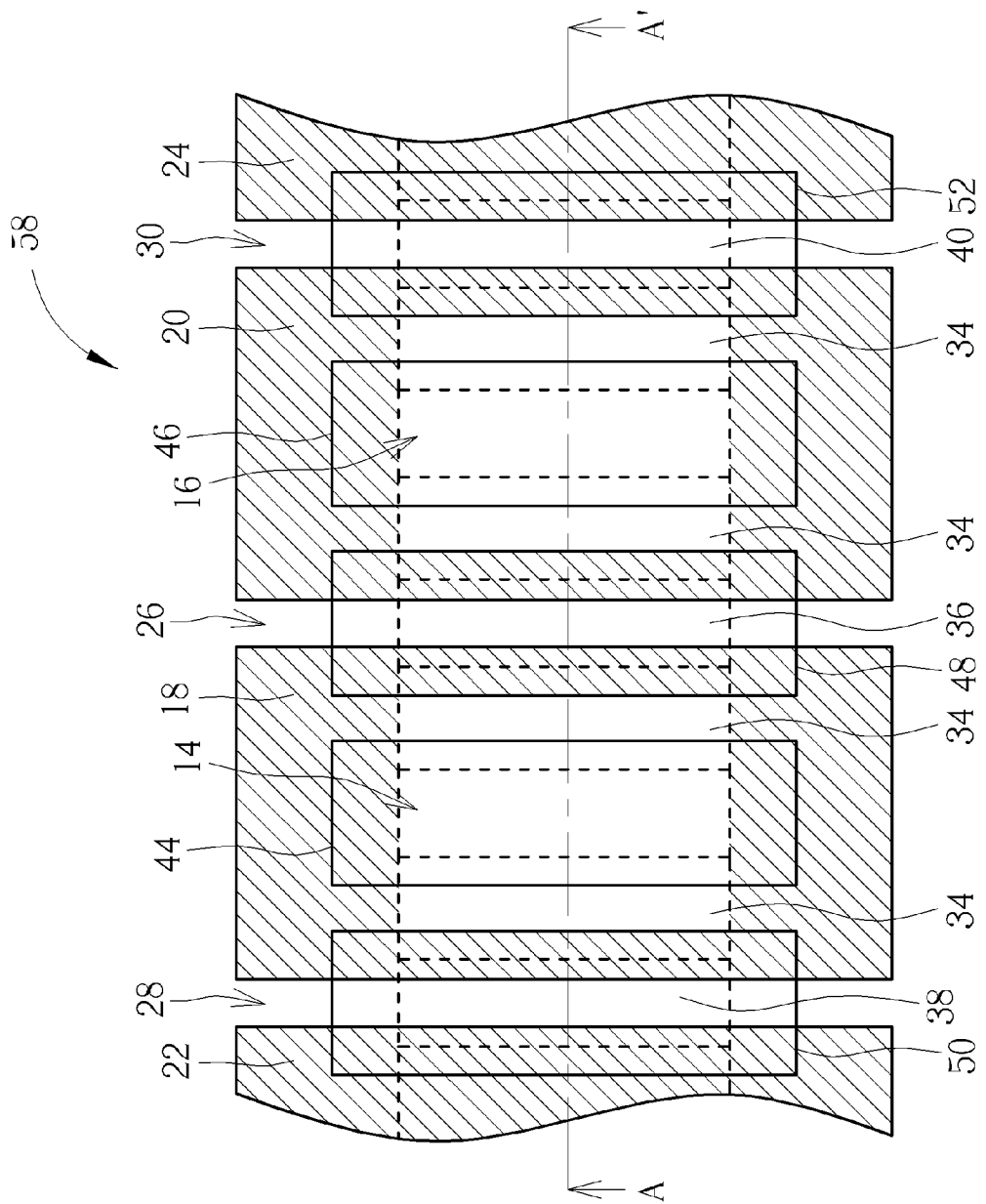
FIG. 1 illustrates a top view of an isolation device according to a preferred embodiment of the present invention.
Figure 2:
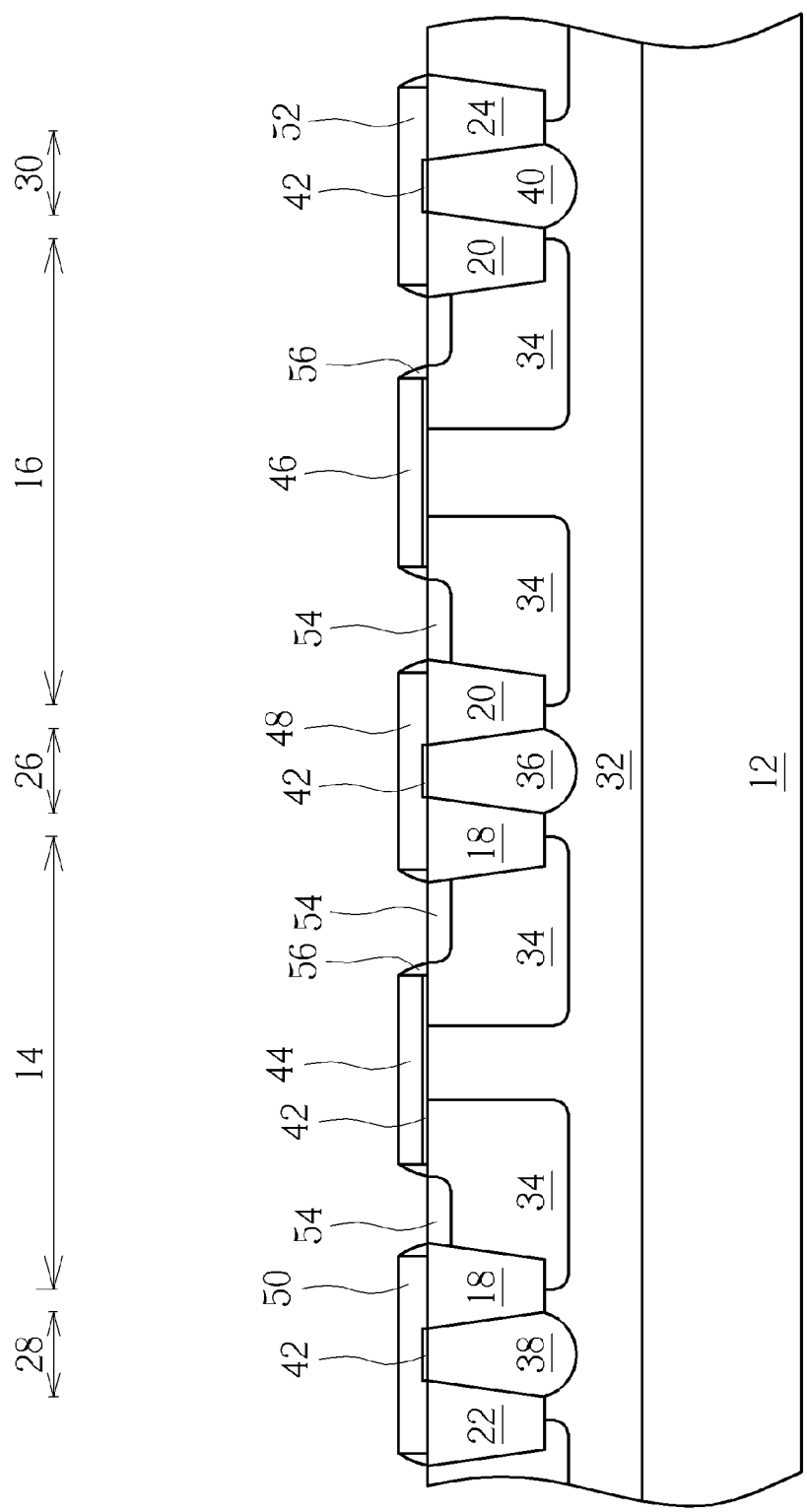
FIG. 2 illustrates a cross-sectional view of FIG. 1 along the sectional line AA'.

Referring to FIGS. 1-2, FIGS. 1-2 illustrate a method for fabricating isolation device or high-voltage device according to a preferred embodiment of the present invention, in which FIG. 1 illustrates a top view of the isolation device while FIG. 2 illustrates a cross-sectional view of FIG. 1 along the sectional line AA'. As shown in FIGS. 1-2, a substrate 12, such as a silicon substrate or silicon-on-insulator (SOI) substrate is provided, and a first device region 14 and a second device region 16 are defined on the substrate 12. The first device region 14 and second device region 16 are preferably used for fabricating high-voltage devices in the later process.

Next, a shallow trench isolation (STI) 58 is formed in the substrate 12, in which the STI 58 includes a first STI 18, a second STI 20, a third STI 22, and a fourth STI 24 in the substrate 12. Preferably, the first STI 18 surrounds the first device region 14, the second STI 20 surrounds the second device region 16, and the third STI 22 and the fourth STI 24 are formed adjacent to the first STI 18 and second STI 20 respectively. For simplicity reason, only part of the third STI 22 and part of the fourth STI 24 are shown in FIGS. 1-2.

In this embodiment, the STIs along sectional line AA' preferably not contact each other while a gap is formed between each of the STIs. For instance, as shown in FIG. 2, a gap 26 is formed between the first STI 18 and second STI 20, a gap 28 is formed between first STI 18 and third STI 22, and a gap 30 is formed between the second STI 20 and the fourth STI 24.

Next, a well region 32 is formed in the substrate 12 to surround the first STI 18, second STI 20, third STI 22, and fourth STI 24.

Next, an ion implantation process is conducted to form a plurality of doped regions 34 on the first device region 14 and second device region 16, in which the doped regions 34 on both first device region 14 and second device region 16 have same conductive type, and the doped regions 34 on both first device region 14 and second device region 16 are preferably used as drift regions for the high-voltage device formed afterwards.

Next, another ion implantation process is conducted to form a doped region in the gap between STIs, such as forming a doped region 36 between the first STI 18 and the second STI 20, forming a doped region 38 between the first STI 18 and the third STI 22, and forming a doped region 40 between the second STI 20 and the fourth STI 24. Preferably, each of the doped regions 36, 38, 40 is formed to fill the gap between adjacent STIs while contacting the two adjacent STIs at the same time. For instance, the doped region 36 between the first STI 18 and second STI 20 preferably contacts the first STI 18 and the second STI 20, the doped region 38 between the first STI 18 and third STI 22 preferably contacts the first STI 18 and the third STI 22, and the doped region 40 between the second STI 20 and fourth STI 24 preferably contacts the second STI 20 and the fourth STI 24.

Preferably, the top surfaces of each of the doped regions 36, 38, 40 are even with the top surfaces of the doped regions 34 and the substrate 12, the doped regions 36, 38, 40 and the well region 32 include same conductive type, and the conductive type of the doped regions 36, 38, 40 and the well region 32 are different from the conductive type of the doped regions 34 in first device region 14 and second device region 16.

It should be noted despite the doped regions 34 are formed in the first device region 14 and second device region 16 before forming the doped regions 36, 38, 40 between STIs, the formation of the doped regions 34 and doped regions 36, 38, 40 is not limited to this order. For instance, it would also be desirable to form the doped regions 36, 38, 40 and then form the doped regions 34, which is also within the scope of the present invention.

Next, a gate oxide layer 42 is formed entirely on the substrate 12, and a gate material layer (not shown) composed of polysilicon is formed on the gate oxide layer 42. A photo-etching process is then conducted to pattern the gate material layer and even the gate oxide layer 42 to form a plurality of gate structures 44, 46, 48, 50, 52 on the substrate 12. In this embodiment, agate structure 44 is formed on the first device region 14, a gate structure 46 is formed on the second device region 16, a gate structure 48 is formed between the first device region 14 and second device region 16, a gate structure 50 is formed between the first device region 14 and adjacent device region (not shown), and a gate structure 52 is formed between the second device region 16 and adjacent device region (not shown).

More specifically, the gate structure 44 on the first device region 14 is disposed between two doped regions 34, or the doped regions 34 are disposed in the well region 32 adjacent to two sides of the gate structure 44. Similarly, the gate structure 46 on the second device region 16 is disposed between two doped regions 34, or the doped regions 34 are disposed in the well region 32 adjacent to two sides of the gate structure 46. It should be noted that the gate structure 48 between the first device region 14 and second device region 16 is disposed to overlap and contact the doped region 36, the first STI 18, and the second STI 20. Similarly, the gate structure 50 between the first device region 14 and adjacent device region (not shown) is disposed to overlap and contact the doped region 38, the first STI 18 and the third STI 22, and the gate structure 52 disposed between the second device region 16 and adjacent device region (not shown) is disposed to overlap and contact the doped region 40, the first STI 20, and the fourth STI 24.

Figure 3:
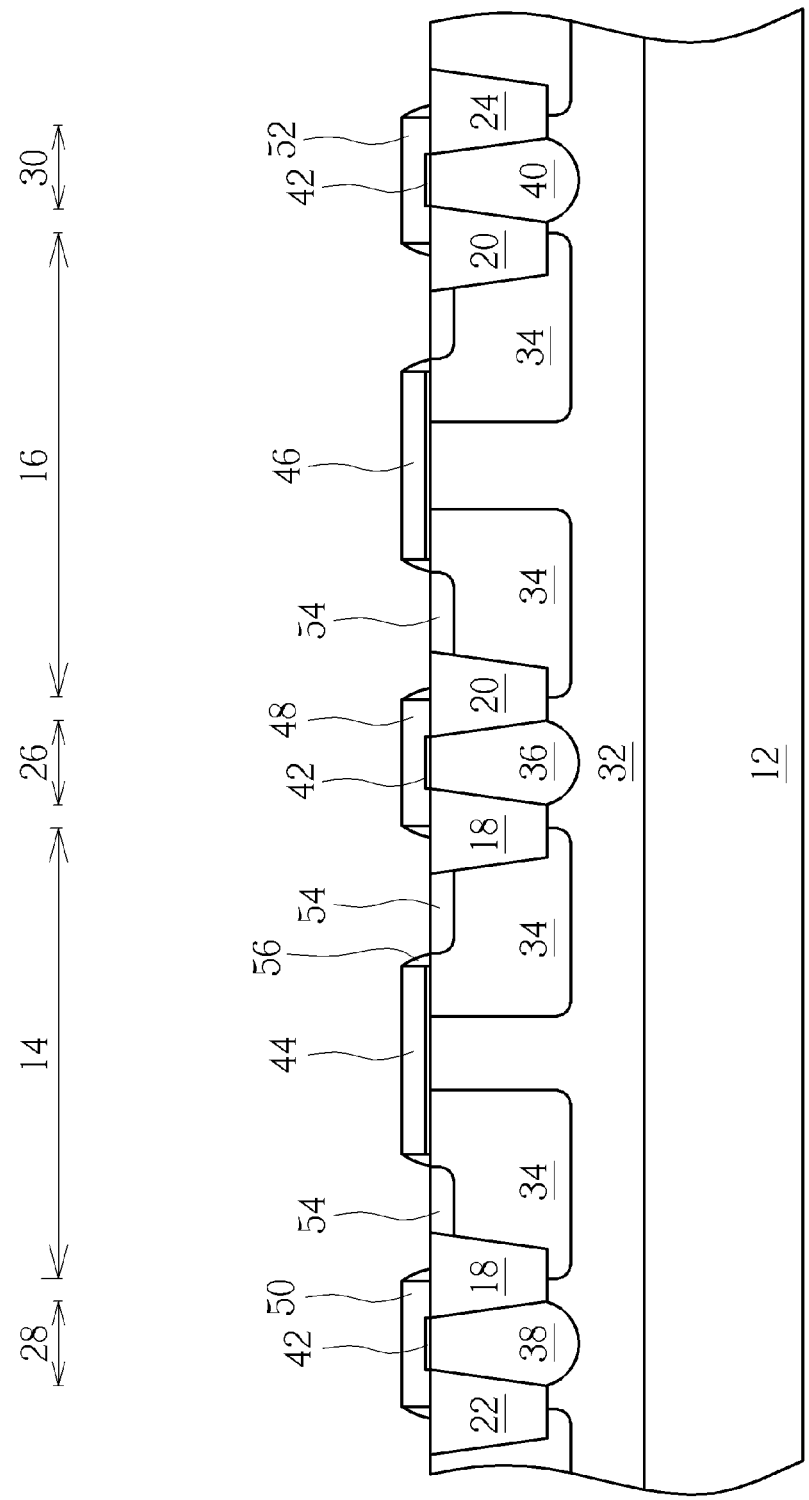
FIG. 3 illustrates a cross-sectional view of an isolation device according to an embodiment of the present invention.

In addition, the gate structure 44 on the first device region 14 and the doped regions 34 adjacent to two sides of the gate structure 44 preferably constitute a high-voltage semiconductor device, the gate structure 46 on the second device region 16 and the doped regions 34 adjacent to two sides of the gate structure 46 constitute another high-voltage semiconductor device, and the gate structure 48, 50, 52 among the first STI 18, second STI 20, third STI 22, and fourth STI 24 are preferably dummy gate structures that could be further extended to other high-voltage regions, in which the width of each dummy gate structure could be substantially equivalent to the widths of the doped regions and STIs underneath combined while the width of each dummy gate structure must be greater than the width of the doped regions underneath. According to an embodiment of the present invention, as shown in FIG. 3, the width of the gate structure 48 could be less than the widths of the doped regions 36, first STI 18, and second STI 20 combined but greater than the width of the doped region 36 alone, the width of the gate structure 50 could be less than the widths of the doped regions 38, first STI 18, and third STI 22 combined but greater than the width of the doped region 38 alone, and the width of the gate structure 52 could be less than the widths of the doped regions 40, second STI 20, and fourth STI 24 combined but greater than the width of the doped region 40 alone.

Next, a spacer 56 is formed on the sidewalls of each of the gate structures 44, 46, 48, 50, 52, and an ion implantation is conducted to form a source/drain region 54 in the doped region 34 adjacent to two sides of the gate structure 44 on first device region 14 and adjacent to two sides of the gate structure 46 on second device region 16. Next, a replacement metal gate (RMG) process could be conducted to transform the gate structure composed of polysilicon into metal gates depending on the demand of the process. This completes the fabrication of a high-voltage device according to a preferred embodiment of the present invention.

It should be noted that in this embodiment, the high-voltage semiconductor devices formed on the first device region 14 and second device region 16 preferably share same conductive type, such as both being NMOS transistor devices and in such instance, the well region 32 is preferably a p-well, the doped regions 34 are preferably n-type doped regions, the source/drain regions 54 are preferably n-type, and the doped regions 36, 38, 40 are preferably p-type doped regions. Alternatively, the high-voltage device could also be PMOS transistors and in such instance, the well region 32 is preferably an n-well, the doped regions 34 are preferably p-type doped regions, the source/drain regions 54 are preferably p-type, and the doped regions 36, 38, 40 are preferably n-type doped regions, which is also within the scope of the present invention.

Figure 4:
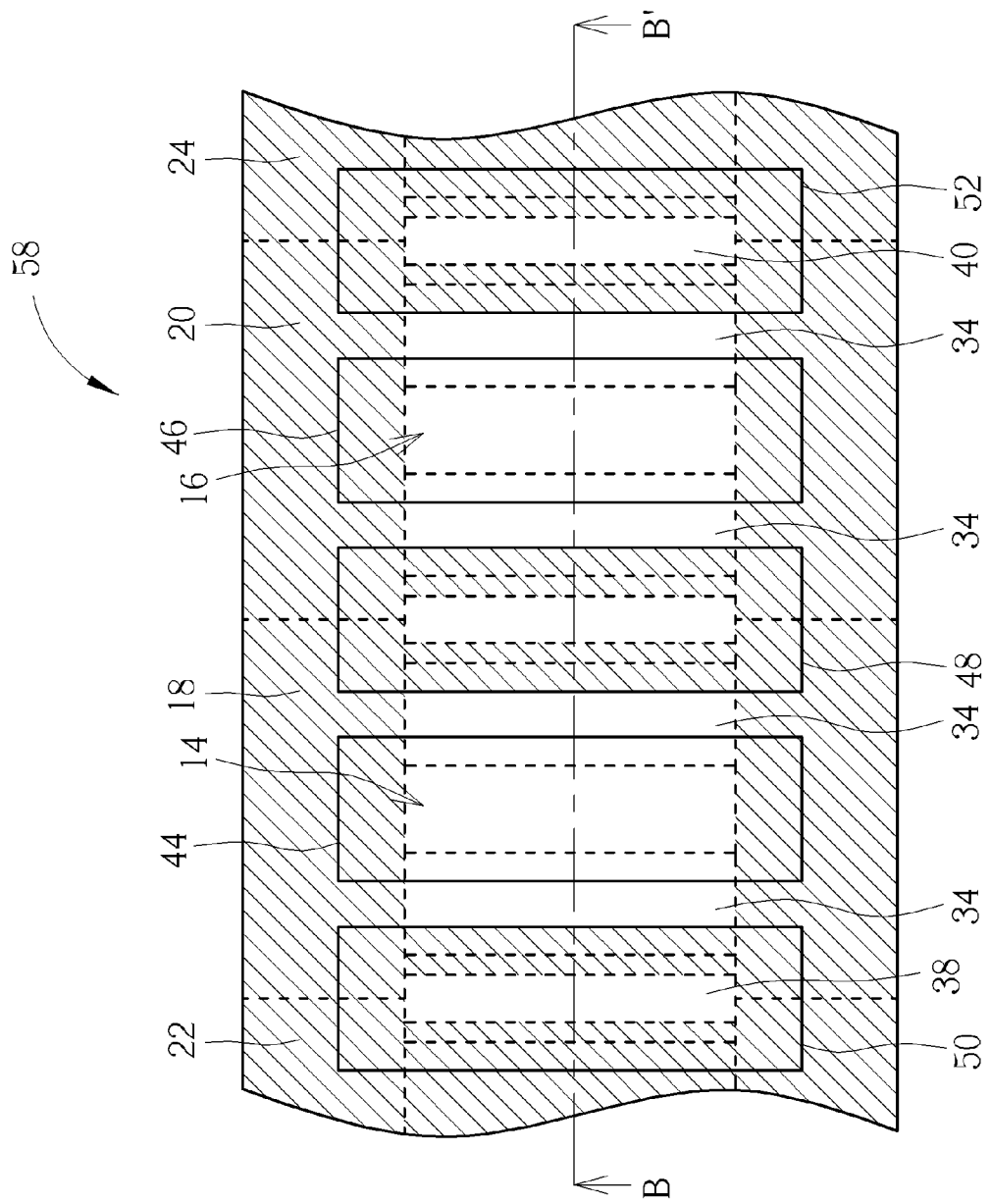
FIG. 4 illustrates a top view of an isolation device according to an embodiment of the present invention.

According to an embodiment of the present invention, as shown in FIG. 4, the STIs outside the active region could be connected to each other while the STIs between device regions still do not contact each other and a gap is still present between adjacent STIs. That is, the STIs still do not contact each other along the sectional line BB' and gaps are present between these STIs. Therefore, the cross-section of FIG. 4 along sectional line BB' is identical to FIG. 2, in which a gap 26 is formed between the first STI 18 and second STI 20, a gap 28 is formed between the first STI 18 and third STI 22, and a gap 30 is formed between the second SSTI 20 and fourth STI 24.

Overall, the present invention discloses an isolation device or high-voltage semiconductor device, which preferably forms a doped region in the gap between two adjacent STIs so that the gate structure formed thereafter could be sitting on the doped region and two adjacent STIs at the same time. Preferably the top surface of the doped region is even with the surface of the substrate and the doped region also contact the two adjacent STIs directly. By using this design, it would be desirable to form dummy gate patterns on STIs thereby allowing flexibility of gate pattern redistribution and also prevent current leakage when voltages are applied to the dummy gate structure and doped region in the substrate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating isolation device, comprising:
   providing a substrate;
   forming a shallow trench isolation (STI) in the substrate, the STI comprises a first STI and a second STI, wherein the first STI surrounds a first device region and the second STI surrounds a second device region;

forming a first doped region between and contact the first STI and the second STI;

forming a first gate structure on and contact the first doped region, the first STI and the second STI; and forming a spacer around the first gate structure, wherein two sidewalls of the spacer are aligned with an edge of the first STI and an edge of the second STI.

2. The method of claim 1, further comprising:

forming a well region in the substrate to surround the first STI and the second STI;

forming second doped regions in the first device region and the second device region;

forming the first doped region; and forming the first gate structure on the first doped region, a second gate structure on the first device region, and a third gate structure on the second device region.

3. The method of claim 2, wherein the first doped region and the second doped regions comprise different conductive type.

4. The method of claim 2, wherein the well region and the first doped region comprise same conductive type.

5. The method of claim 1, further comprising forming the first STI and the second STI in the substrate so that a gap is formed between the first STI and the second STI.

6. The method of claim 5, further comprising forming the first doped region in the gap.

7. The method of claim 1, wherein the top surfaces of the first doped region and the substrate are coplanar.

8. An isolation device, comprising:

a substrate;

a shallow trench isolation (STI) in the substrate, wherein the STI comprises a first STI and a second STI, and the first STI surrounds a first device region and the second STI surrounds a second device region;

a first doped region between and contact the first STI and the second STI;

a first gate structure on and contact the first doped region, the first STI and the second STI; and a spacer around the first gate structure, wherein two sidewalls of the spacer are aligned with an edge of the first STI and an edge of the second STI.

9. The isolation device of claim 8, further comprising:

a well region in the substrate;

a plurality of second doped regions in the first device region and the second device region;

a second gate structure on the first device region; and a third gate structure on the second device region.

10. The isolation device of claim 9, wherein the first doped region and the second doped regions comprise different conductive type.

11. The isolation device of claim 9, wherein the well region and the first doped region comprise same conductive type.

12. The isolation device of claim 8, wherein the top surfaces of the first doped region and the substrate are coplanar.

* * * * *